US010262916B2

(12) United States Patent
Wu

(10) Patent No.: US 10,262,916 B2
(45) Date of Patent: Apr. 16, 2019

(54) FOLDABLE GRAPHITE HEAT SPREADER

(71) Applicant: JONES TECH INC., Sunnyvale, CA (US)

(72) Inventor: Xiaoning Wu, Beijing (CN)

(73) Assignee: JONES TECH INC., Sunnyvale, CA (US)

( * ) Notice: Subject to any disclaimer, the term of this patent is extended or adjusted under 35 U.S.C. 154(b) by 23 days.

(21) Appl. No.: 15/384,339

(22) Filed: Dec. 20, 2016

(65) Prior Publication Data

US 2018/0177074 A1 Jun. 21, 2018

(51) Int. Cl.
*H05K 7/20* (2006.01)
*H01L 23/34* (2006.01)
*G06F 1/20* (2006.01)

(52) U.S. Cl.
CPC ............... *H01L 23/34* (2013.01); *G06F 1/20* (2013.01)

(58) Field of Classification Search
None
See application file for complete search history.

(56) References Cited

U.S. PATENT DOCUMENTS

| 4,888,242 A * | 12/1989 | Matsuo | B32B 3/28 |
| | | | 428/408 |
| 5,510,174 A * | 4/1996 | Litman | C08K 3/38 |
| | | | 428/343 |

(Continued)

FOREIGN PATENT DOCUMENTS

EP 2636643 A1 * 9/2013 ............ C04B 35/52

OTHER PUBLICATIONS

Definition "corrugate" from dictionary.com, retrrived Mar. 13, 2018.*

(Continued)

*Primary Examiner* — Anish P Desai
(74) *Attorney, Agent, or Firm* — Apex Attorneys at Law, LLP; Yue (Robert) Xu

(57) ABSTRACT

Disclosed is a foldable graphite heat spreader for reducing the internal temperature of an electronic device. The foldable graphite heat spreader includes a multi-layer graphite lamination having a top surface, a bottom surface and a corrugated surface along the bending areas of the electronic device. The multi-layer graphite lamination spreads heat on the hot spots or takes heat away the components of the electronic device. The top surface includes a first top end and a second top end. The bottom surface includes a first bottom end and a second bottom end. The corrugated surface includes a top corrugated surface and a bottom corrugated surface and have spring characteristic to expand when bending, to contract back its original shape when no bending. The foldable graphite heat spreader includes a protective plastic film for providing protection to the top surface and the top corrugated surface of the multi-layer graphite lamination from dropping particles of graphite. The protective plastic film provides protection to the bottom corrugated surface and at least a portion of the bottom surface at bending location graphite without damage from bending operation. Further, the foldable graphite heat spreader includes a pressure sensitive adhesive attached to the heat-generating surface of the electronic device.

4 Claims, 3 Drawing Sheets

(56) References Cited

U.S. PATENT DOCUMENTS

| | | | | |
|---|---|---|---|---|
| 2003/0155103 A1* | 8/2003 | Barten | ............... | F28F 3/025 |
| | | | | 165/80.3 |
| 2005/0142317 A1* | 6/2005 | Clovesko | ............ | B32B 9/00 |
| | | | | 428/40.1 |
| 2011/0232881 A1* | 9/2011 | Downing | ......... | H05K 7/20454 |
| | | | | 165/133 |
| 2015/0189792 A1* | 7/2015 | Kenna | ............... | B23P 15/26 |
| | | | | 361/704 |

OTHER PUBLICATIONS

Wu, Xiaoning, "Thermal Conductor", English translation of WO 2014/036739 A, published on Mar. 13, 2014. (Year: 2014).*

* cited by examiner

FOLDABLE GRAPHITE HEAT SPREADER

BACKGROUND OF THE INVENTION

1. Field of the Invention

The present invention generally relates to a graphite heat spreader, and more particularly relates to a foldable graphite heat spreader to reduce the internal temperature of device and make uniform surface temperature effectively.

2. Description of Related Art

Heat spreaders can be made from synthetic graphite sheet materials. These spreaders take advantage of the anisotropic thermal properties of synthetic graphite. Synthetic graphite exhibits a high thermal conductivity over 1500 W/mk in the plane of the sheet combined with a much lower thermal conductivity through the thickness of the sheet. Synthetic graphite spreaders are thinner, passive and commonly used within portable electronic enclosures to move heat from discrete components to the walls of the enclosure or eliminating hot spots on the housing of hand-held electronic devices.

Graphite heat spreaders, which are single layer or multi-layer graphite stacked, have been widely used in today portable electronic devices. The existing multi-layer graphite heat spreader is straight and further is not bendable to spread the heat throughout the electrical components of the electronic devices.

In existing foldable electronic devices such as smart phone or notebook, it requires the bending of multi-layer graphite heat spreaders. The folding of the heat spreader results in breakage due to limited elongation property of the graphite. The spread of heat cause breakage of graphite layers due to the limited elongation (2-3%) property of the graphite.

Therefore, there is a need of foldable multi-layer graphite heat spreader that elongates without breakage. The foldable multi-layer graphite heat spreader should further include a protective plastic films for protection and pressure sensitive adhesive (PSA) for attachment. The foldable multi-layer graphite heat spreader should be able to increase the elongation property of the graphite layers.

SUMMARY OF THE INVENTION

In accordance with teachings of the present invention, a foldable graphite heat spreader for reducing the internal temperature of an electronic device is provided.

An object of the present invention is to provide a foldable graphite heat spreader for reducing the internal temperature of an electronic device. The foldable graphite heat spreader includes a multi-layer graphite lamination and a protective plastic film. The multi-layer graphite lamination spreads heat throughout the components of the electronic device. The protective plastic films seal the top surface and at least portion of the bottom surface to avoid dropping of particles of graphite from the multi-layer graphite lamination.

The multi-layer graphite lamination is having a top surface, a bottom surface and a corrugated surface along the bending areas of the electronic device. The multi-layer graphite lamination spreads heat throughout the components of the electronic device. The top surface is having a first top end and a second top end. The bottom surface is having a first bottom end and a second bottom end. The corrugated surface is having a top corrugated surface and a bottom corrugated surface.

At bending location of electronics devices, a bump or corrugation structure section is design into length of multi layer graphite module to facilitate the elongation of multi-layer graphite module caused during open-closed operation of electronics devices. The bump or corrugation structure are design to have spring characteristic to expand when bending, to contract back its original shape when no bending.

The protective plastic films for providing protection to the top surface and the top corrugated surface of the multi-layer graphite lamination from breaking during elongation due to the heat spread. The protective plastic film provides protection to the bottom corrugated surface and at least a portion of the bottom surface.

Another object of the present invention is to provide a first pressure sensitive adhesive (PSA) film attached to the first bottom end of the multi-layer graphite lamination and a second pressure sensitive adhesive (PSA) film attached to the second bottom end of the second graphite layer. The first pressure sensitive adhesive and the second pressure sensitive adhesive are configured to attach the multi-layer graphite lamination to the heat-generating surface of the electronic device.

Another object of the present invention is to provide the foldable graphite heat spreader with the protective plastic film completely surrounding the multi-layer graphite lamination. Further, the foldable graphite heat spreader includes a third pressure sensitive adhesive configured between the top surface of the multi-layer graphite lamination and the protective plastic film. The third pressure sensitive adhesive attaches the first top end to the heat-generating surface of the electronic device.

Another object of the present invention is to provide the foldable graphite heat spreader with a fourth pressure sensitive adhesive configured between the top surface of the multi-layer graphite lamination and the protective plastic film. The fourth pressure sensitive adhesive attaches the second top end of the top surface of the multi-layer graphite lamination to the heat-generating surface of the electronic device.

Another object of the present invention is to provide the foldable graphite heat spreader with a fifth pressure sensitive adhesive configured to attach the protective plastic film to the heat-generating surface of the electronic device. Further, the foldable graphite heat spreader includes metal inserts to maintain thermal conductivity in each graphite layer of the multi-layer graphite lamination.

These and other features and advantages will become apparent from the following detailed description of illustrative embodiments thereof, which is to be read in connection with the accompanying drawings.

DETAILED DESCRIPTION OF DRAWINGS

Figure 1:
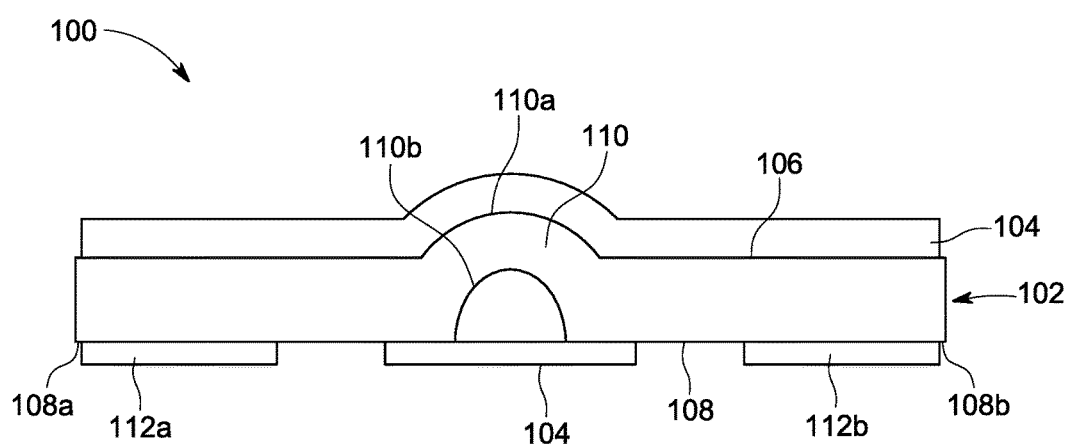
FIG. 1 illustrates a side view of a foldable graphite heat spreader for reducing the internal temperature of an electronic device in accordance with a preferred embodiment of the present invention.

While this technology is illustrated and described in a preferred embodiment a foldable graphite heat spreader for reducing the internal temperature of an electronic device may be produced in many different configurations, shapes, sizes, forms and materials. There is depicted in the drawings, and will herein be described in detail, as a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the technology described herein.

FIG. 1 illustrates a side view of a foldable graphite heat spreader 100 for reducing the internal temperature of an electronic device in accordance with a preferred embodiment of the present invention. The foldable graphite heat spreader 100 includes a multi-layer graphite lamination 102 and a protective plastic film 104.

The multi-layer graphite lamination 102 includes a top surface 106, a bottom surface 108, and a corrugated surface 110 along the bending areas of the electronic device. The multi-layer graphite lamination 102 spreads heat throughout the components of the electronic device. In a preferred embodiment of the present invention, the corrugated surface 110 is designed into length to facilitate the elongation of multi-layer graphite lamination 102. The corrugated surface has an S shape.

The bottom surface 108 includes a first bottom end 108a and a second bottom end 108b. The first bottom end 108a and the second bottom end 108b are the front and distal end of the bottom surface 108. The corrugated surface 110 includes a top corrugated surface 110a and a bottom corrugated surface 110b.

The protective plastic film provides protection to the top surface 106 and the top corrugated surface 110a of the multi-layer graphite lamination 102 from breaking during elongation due to heat spread. The protective plastic film 104 provides protection to the bottom corrugated surface 110b and at least a portion of the bottom surface 108.

The protective plastic film 104 seals the top surface 106 and the top corrugated surface to avoid dropping of particles of graphite from the multi-layer graphite lamination 102. Further, the protective plastic film 104 seals the at least portion of the bottom surface 108 and the bottom corrugated surface 110b to protect graphite getting damaged during bending operation. Example of the protective plastic film 104 includes but not limited to Apical, Kapton, UPILEX, VTEC PI, Norton TH, Kaptrex and polyimide films.

In another preferred embodiment of the present invention, a first pressure sensitive adhesive (PSA) film 112a is attached to the first bottom end 108a of the multi-layer graphite lamination 102, and a second pressure sensitive adhesive film 112b is attached to the second bottom end 108b of the multi-layer graphite lamination 102.

The first pressure sensitive adhesive 112a and the second pressure sensitive adhesive 112b is configured to attach the multi-layer graphite lamination 102 to the heat-generating surface of the electronic device. Examples of the first pressure sensitive adhesive 112a and the second pressure sensitive adhesive 112b include but not limited to blend of natural or synthetic rubber and resin, acrylic, silicone or other polymer systems, with or without additives.

In another exemplary embodiment of the present invention, a 7-layer graphite lamination consists of two 5 μm graphite lamination and five 32 μm graphite lamination. Further, the pressure sensitive adhesive of 5 μm is attached between each layer of the 7-layer graphite lamination.

The above structure of 7-layer graphite lamination is able to pass the 20000 cycle bending testing @$R_1$=1.5 mm. The change in thermal conductivity before and after bending test is within 10%. The table below shows total thickness of 7-layer graphite lamination.

|  | Thickness, μm | Layers | Thickness, μm |
| --- | --- | --- | --- |
| Graphite 1 | 25 | 2 | 50 |
| Graphite 2 | 32 | 5 | 160 |
| PSA | 5 | 8 | 40 |
| PI Film | 25 | 2 | 50 |
| Total |  |  | 300 |

Figure 2:
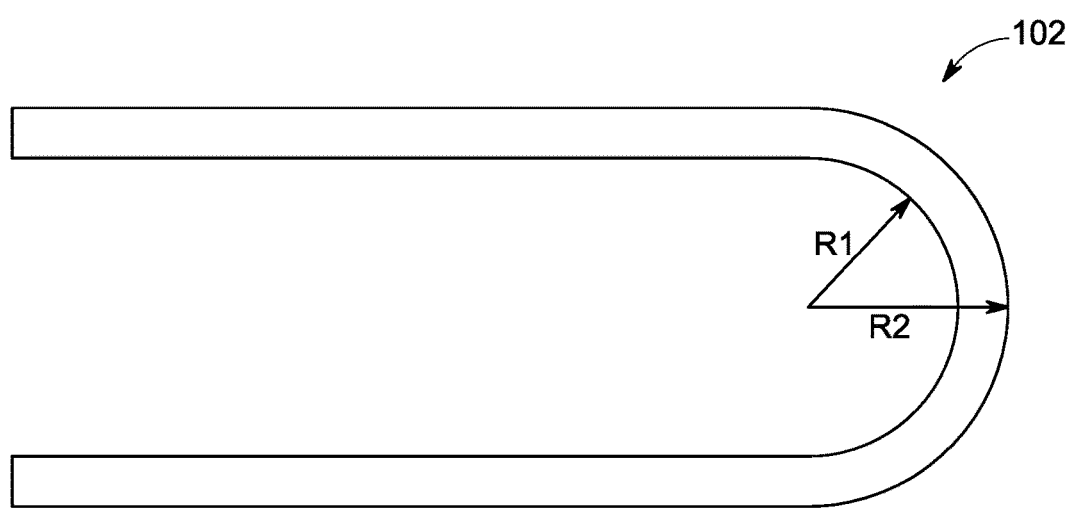
FIG. 2 illustrates a top view of foldable multi-layer graphite lamination in accordance with a preferred embodiment of the present invention.

FIG. 2 illustrates a top view of foldable multi-layer graphite lamination 102 in accordance with a preferred embodiment of the present invention. The multi-layer graphite heat lamination 102 is used for high heat energy transferring application. The multi-layer graphite lamination 102 is able to achieve a very high thermal conductivity i.e. more than 1300 W/m-k.

The diameter of the top corrugated surface $R_2$ is more than the diameter of the bottom corrugated surface $R_1$. The elongation of the graphite at the outer surface is $(R_2-R_1)/R_1$. In an exemplary embodiment of the present invention, if the thickness of multi-layer graphite is 0.2 mm for 3 mm bending radius, then the elongation is 7.7%.

The multi-layer graphite lamination 102 ensures that there is no breakage of internal structure and does not let degradation of thermal conductivity. If the thermal conductivity reaches beyond 15%, then the purpose of graphite layer is failed. The following table displays the tensile strength and elongation of graphite at test speed of 10 mm/min.

| Part Number | Test Speed (mm/min) | Tensile Strength (MPa) | | | | Elongation, % at Break | | | |
| --- | --- | --- | --- | --- | --- | --- | --- | --- | --- |
| | | 1 | 2 | 3 | Average | 1 | 2 | 3 | Average |
| Graphite | 10 | 74 | 81 | 58 | 71 | 2.3 | 2.3 | 2.3 | 2.3 |

Figure 3:
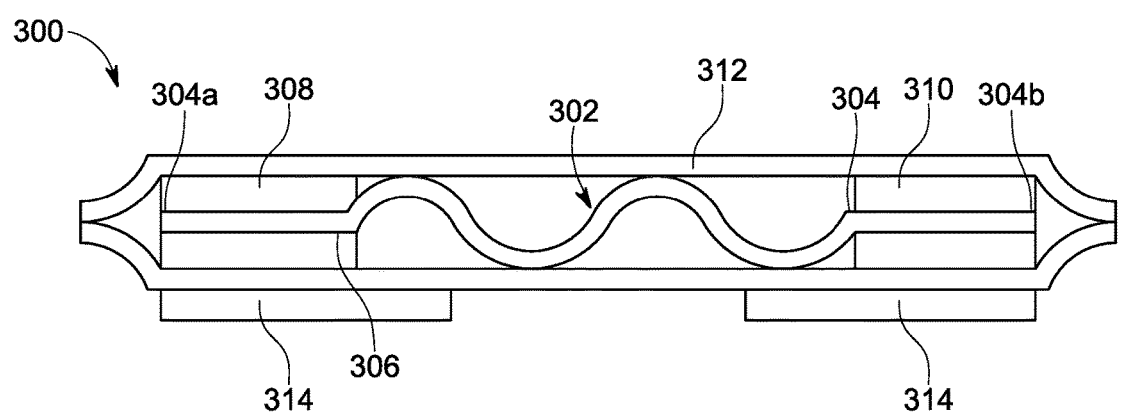
FIG. 3 illustrates a side view of a foldable graphite heat spreader showing plurality of pressure sensitive adhesive (PSA) and protective plastic film.

FIG. 3 illustrates a side view of a foldable graphite heat spreader 300 showing plurality of pressure sensitive adhesive (PSA) and protective plastic film in accordance with another preferred embodiment of the present invention. The multi-layer graphite layer 302 includes a top surface 304 and a bottom surface 306. The top surface 304 includes a first top end and 304a a second top end 304b.

In another preferred embodiment of the present invention, the foldable graphite heat spreader 300 includes a protective plastic film 312 that completely surrounds the multi-layer graphite lamination 302. Further, the foldable graphite heat spreader 300 includes a third pressure sensitive adhesive film 308 attached to the first top end 304a and a fourth pressure sensitive adhesive film 310 attached to the second top end 304b between the top surface, respectively between the top surface 304 and multi-layer graphite lamination 302.

Further in another preferred embodiment of the present invention, the foldable graphite heat spreader 300 includes a fifth pressure sensitive adhesive 314 is configured to attach the protective plastic film 312 to the heat-generating surface of the electronic device.

In another exemplary embodiment of the present invention, the foldable graphite heat spreader includes a two layer graphite module consists of two 25 μm graphite layers and a 5 μm pressure sensitive adhesive between each layer of graphite. The foldable graphite heat spreader is able to pass the 20000 cycle bending testing @ $R_1$=1.5 mm. The change of thermal conductivity before and after bending test is within 10%.

The table below shows total thickness of 7-layer graphite lamination:

|  | Thickness, μm | Layers | Thickness, μm |
|---|---|---|---|
| Graphite 1 | 25 | 2 | 50 |
| Graphite 2 | 32 | 5 | 160 |
| PSA | 5 | 8 | 40 |
| PI Film | 25 | 2 | 50 |
| Total |  |  | 300 |

Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

The invention claimed is:

1. A foldable graphite heat spreader for reducing the internal temperature of an electronic device, the foldable graphite heat spreader comprising:
   a multi-layer graphite lamination having a top surface, a bottom surface and a corrugated surface, wherein the multi-layer graphite lamination spreads heat throughout the components of the electronic device, wherein the top surface having a first top end and a second top end, wherein the bottom surface having a first bottom end and a second bottom end, wherein the corrugated surface having a top corrugated surface and a bottom corrugated surface;
   a protective plastic film for providing protection to the top surface and the top corrugated surface of the corrugated surface from breaking during elongation due to heat spread, wherein the protective plastic film provides protection to the bottom corrugated surface and at least a portion of the bottom surface to protect from the bending operation, wherein the protective plastic film completely surrounds the multi-layer graphite lamination; and
   the foldable graphite heat spreader further comprises:
      a pressure sensitive adhesive film provided between the top surface of the multi-layer graphite lamination and the protective plastic film, wherein the pressure sensitive adhesive film attaches the first top end of the top surface of the multi-layer graphite lamination to the protective plastic film; and
      another pressure sensitive adhesive film provided between the top surface of the multi-layer graphite lamination and the protective plastic film,
   wherein the another pressure sensitive adhesive film attaches the second top end of the top surface of the multi-layer graphite lamination to the protective plastic film; and
   wherein the corrugated surface has an S shape and is designed to facilitate the elongation of multi-layer graphite module, and the corrugated surface expands when it is bent and contracts back its original shape when it is not bent.

2. The foldable graphite heat spreader according to claim 1 further comprising another pressure sensitive adhesive configured to attach the protective plastic film to the heat-generating surface of the electronic device.

3. The foldable graphite heat spreader according to claim 1 further comprising metal inserts to maintain thermal conductivity in each layer of the multi-layer graphite lamination.

4. The foldable graphite heat spreader according to claim 1 wherein a further pressure sensitive adhesive is provided between each layer of the multi-layer graphite lamination.

* * * * *